(12) United States Patent
Wong et al.

(10) Patent No.: US 8,643,168 B1
(45) Date of Patent: Feb. 4, 2014

(54) INTEGRATED CIRCUIT PACKAGE WITH INPUT CAPACITANCE COMPENSATION

(71) Applicant: Lattice Semiconductor Corporation, Hillsboro, OR (US)

(72) Inventors: Ban P. Wong, Milpitas, CA (US); Brad Sharpe-Geisler, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 13/685,385

(22) Filed: Nov. 26, 2012

Related U.S. Application Data

(60) Provisional application No. 61/714,636, filed on Oct. 16, 2012.

(51) Int. Cl.
*H01L 23/12* (2006.01)

(52) U.S. Cl.
USPC ................................. 257/700; 257/E23.069

(58) Field of Classification Search
USPC ........................... 257/689, 699, 700, E23.069
See application file for complete search history.

(56) References Cited

U.S. PATENT DOCUMENTS

| 5,140,407 A | 8/1992 | Kamada |
| 6,876,085 B1 * | 4/2005 | Handforth et al. ............ 257/775 |
| 7,064,627 B2 | 6/2006 | Hsu |
| 7,247,937 B2 | 7/2007 | Jiang et al. |
| 8,143,976 B2 | 3/2012 | Wyland |
| 2010/0232480 A1 | 9/2010 | Bhandal et al. |

FOREIGN PATENT DOCUMENTS

JP          7147352 A       6/1995

OTHER PUBLICATIONS

Kim, Namhoo, et al., "Spiral Via Structure in a BGA Package to Mitigate Discontinuities in Multi-Gigabit SERDES System", IEEE—Electronic Components and Technology Conference, 2010, pp. 1474-1478.

* cited by examiner

*Primary Examiner* — Quoc Hoang

(57) ABSTRACT

A ball-grid-array (BGA) package is disclosed that includes traces within a BGA substrate. At least one of the traces is configured to match a low-impedance load presented by a BGA substrate pad and associated circuitry on a flip-chip die to an impedance of a circuit board trace. Each configured trace includes a relatively narrow section coupling to a tapered section that widens from the relatively narrow section to join a relatively wider trace section.

20 Claims, 5 Drawing Sheets

INTEGRATED CIRCUIT PACKAGE WITH INPUT CAPACITANCE COMPENSATION

RELATED APPLICATION

This application claims the benefit of U.S. Provisional Application No. 61/714,636, filed Oct. 16, 2012, which is incorporated herein in its entirety.

TECHNICAL FIELD

The present invention relates generally to integrated circuits, and more particularly to an integrated circuit package with input capacitance compensation.

BACKGROUND

Integrated circuits are typically mounted onto circuit boards that route signals and power to the integrated circuits using conductive traces that are designed to have a desired characteristic impedance. For a single trace, the impedance is typically around 50 ohms whereas the differential resistance for a differential pair of traces is 100 ohms (corresponding to a common-mode resistance of 25 ohms). The conductive traces act as transmission lines for the signals they carry. As is well known in the transmission line arts, signal reflections result if a transmission line drives a load that is not matched to the characteristic impedance of the line. Thus, it is desirable to match the input/output impedance of an integrated circuit to the printed circuit board impedance to prevent these unwanted signal reflections and associated glitches.

For example, a ball grid array (BGA) package 100 is shown in FIG. 1. BGA package 100 includes a BGA substrate 105 and an integrated circuit semiconductor die 110. Semiconductor die 110 can be connected to BGA substrate 105 through, for example, wire bonding or flip-chip methods. FIG. 1 illustrates a flip-chip construction in which the active surface of die 110 is "flipped" so that it faces substrate 105 and conducts to substrate 105 through a plurality of flip-chip solder bumps 115 that couple to corresponding pads on the die. In contrast, if the die were wire-bonded, the active surface of the die would face away from the package substrate. Since the active surface of die 110 faces substrate 105, BGA integrated circuit package 100 may also be denoted as a flip-chip BGA package 100 in that the substrate is flipped with regard to a wire-bonding orientation.

BGA substrate 105 conducts to traces (not shown) on a printed circuit board 120 through an array of solder balls 125, hence the name "ball grid array." BGA substrate 105 in turn includes conductive traces to couple a given solder ball 125 to a corresponding flip-chip bump 115. FIG. 2 is a cross-sectional view of BGA package 100 to illustrate a plurality of BGA substrate conductive traces 200. These BGA substrate traces are designed to have the same characteristic impedance as the traces used on circuit board 120. But the on-die structures such as input/output buffers, termination resistors, and electrostatic discharge (ESD) circuits typically introduce significant amounts of capacitance. Moreover, the pads and associated metallization of BGA substrate 105 also add to this capacitive load. The resulting capacitance introduces an impedance mismatch between the die circuitry and the BGA substrate traces. This mismatch is frequency dependent and thus increases at higher frequencies.

To address this impedance mismatch, it is conventional to use on-die planar inductors. But such die structures use valuable silicon area and thus increase cost. Accordingly, there is a need in the art for improved impedance matching architectures for integrated circuits.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

As discussed previously, the pads on ball grid array (BGA) substrate 105 in conjunction with associated circuitry on die 110 have a relatively-high capacitance. Such capacitance represents a low-impedance load to a high-speed signal. In contrast, the traces on circuit board 120 have a relatively-high impedance. To address the impedance mismatch, the BGA substrate traces are modified such that pads on the BGA substrate couple to low-impedance matching trace sections in the BGA substrate that are configured to have a relatively-high inductance. This inductance in combination with the capacitance of the pads and associated circuitry on the die present an impedance-matched load to the signals coming from the circuit board trace.

Figure 3:
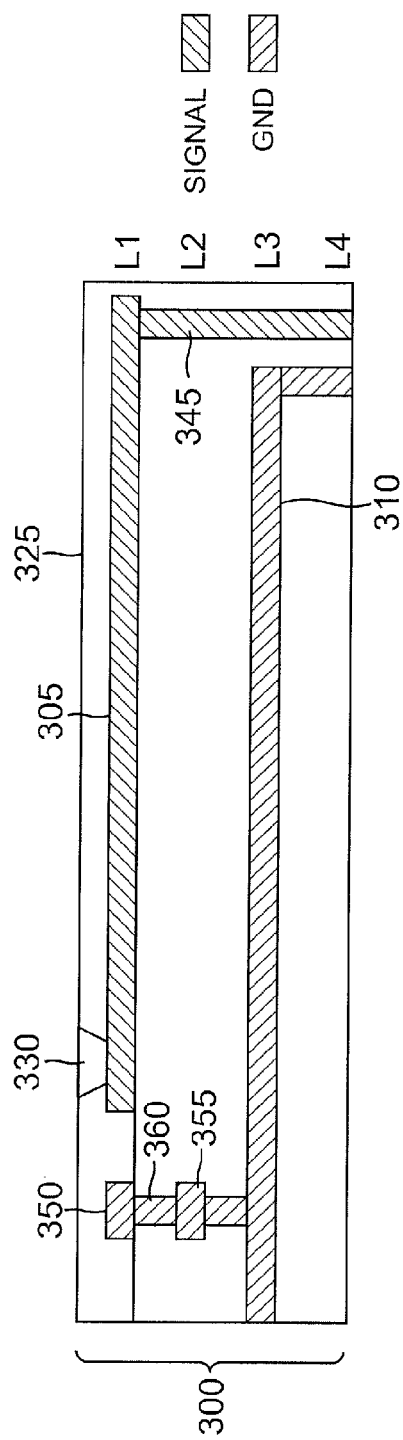
FIG. 3 is a cross-sectional view of the BGA package substrate of FIG. 1 in accordance with an embodiment in which a high-speed signal trace is formed in an uppermost-metal layer and includes a tapered section.
Figure 4:
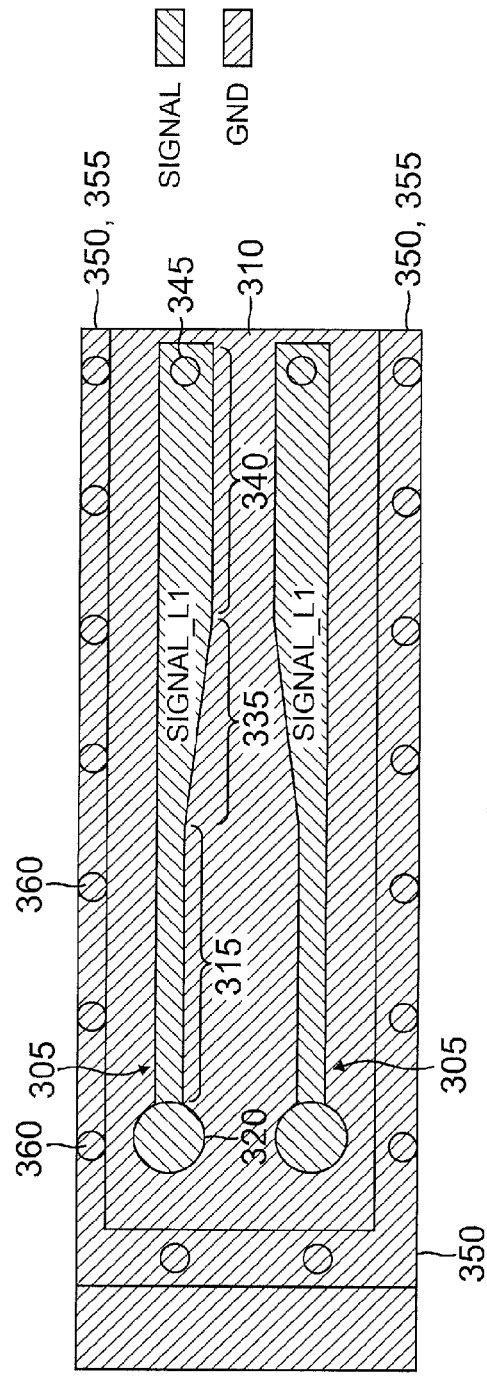
FIG. 4 is a partially-cutaway top view of the improved BGA package substrate of FIG. 3.

FIG. 3 shows a cross-sectional view of a BGA substrate 300 having these advantageous matching properties whereas FIG. 4 is a top view of BGA substrate 300. As is known in the arts, BGA substrate 300 includes a plurality of metal layers that are used to form conductive traces. These layers are separated by dielectric layers. In the illustrated embodiments, there are four metal layers L1, L2, L3, and L4. However, it will be appreciated that the actual number of metal layers may vary in alternative embodiments. For example, it is conventional to have eight metal layers. Such additional metal layers are not shown in FIGS. 3 and 4 but those of ordinary skill will appreciate that they may be present. These additional metal layers may be specialized to the routing of low-speed signals. In contrast, the structures described herein for layers L1, L2, and L3 are specialized for the routing of high-speed signals.

Figure 1:
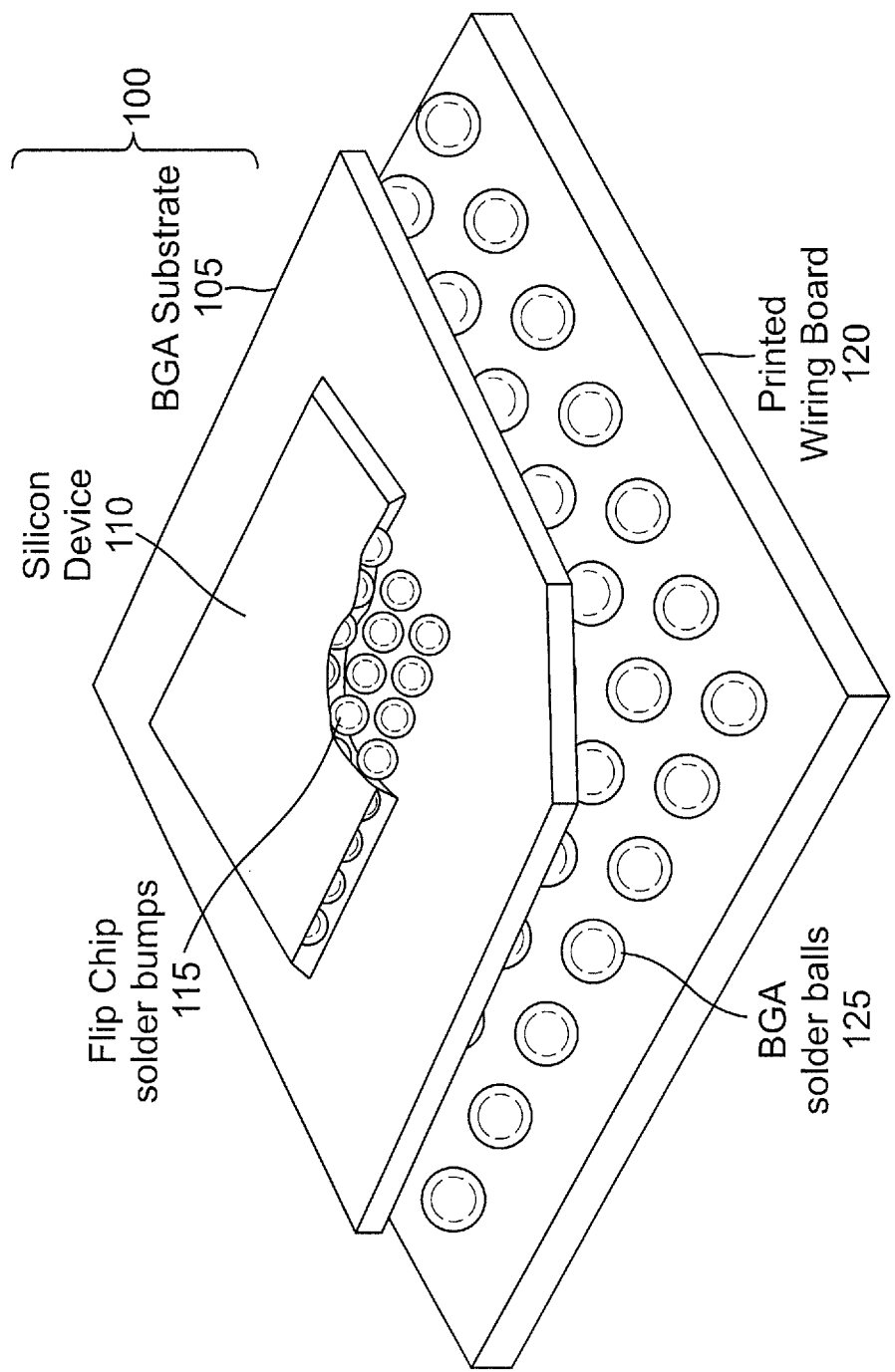
FIG. 1 is a partially-cutaway perspective view of a ball-grid-array (BGA) integrated circuit package mounted on a circuit board in accordance with an embodiment of the disclosure.
Figure 2:
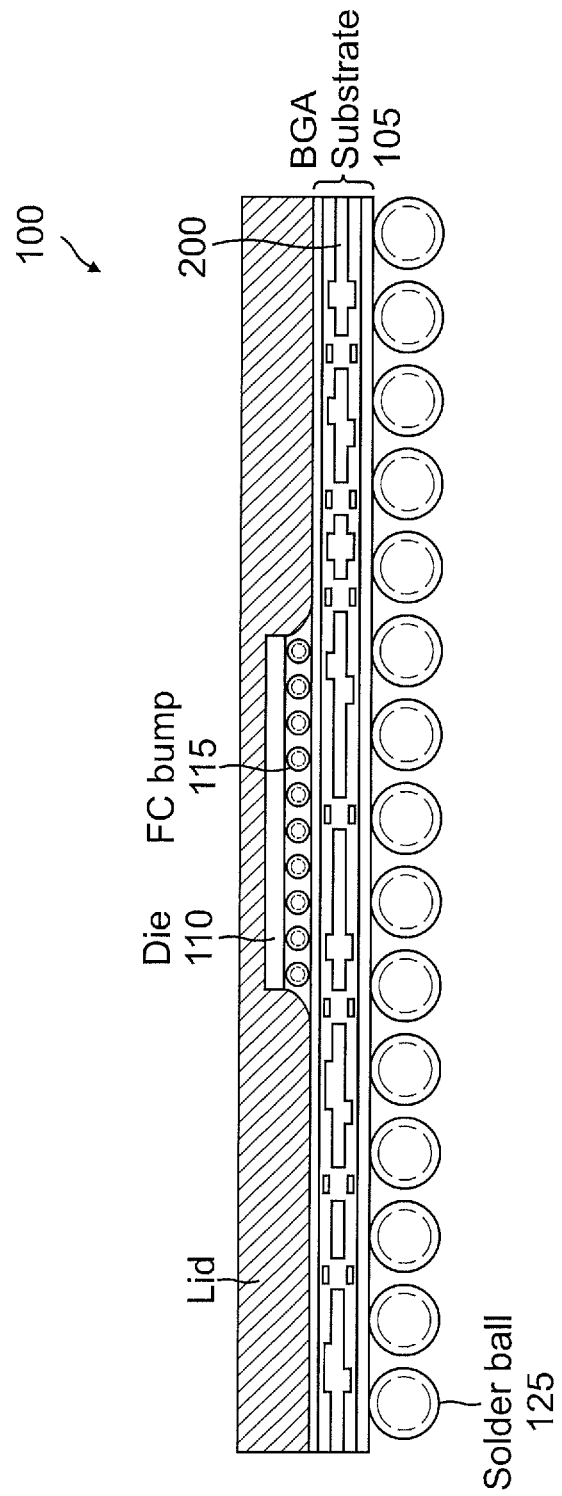
FIG. 2 is a cross-sectional view of the BGA package of FIG. 1.

One or more high-speed signal traces 305 are formed in metal layer L1. A ground plane 310 is formed in metal layer L3. Thus, traces 305 are separated from ground plane 310 by a metal layer L2 sandwiched between insulating dielectric layers (metal layer L2 being etched away in the area between traces 305 and ground plane 310). This separation between traces 305 and ground plane 310 decreases the capacitance. Trace 305 ends in a relatively-narrow section 315, which will thus have a relatively-high inductance and a relatively-low capacitance. Each narrow trace section 315 connects to a corresponding pad 320. As known in the BGA package arts, a solder resist layer 325 includes an opening 330 above each pad 320 to receive a solder bump from a flip-chip die (discussed with regard to FIG. 1). Pad 320 connects to circuitry within the flip-chip die that introduces significant capacitance in addition to the capacitance from the pad itself. This is problematic in that the circuit board traces and the BGA package traces are conventionally designed to have some desired impedance such as fifty Ω for a single-ended trace (or a twenty-five Ω common-mode impedance and a one-hundred Ω differential impedance for a differential pair of traces).

In a transmission line, the impedance is proportional to the square root of an inductance/capacitance ratio. Thus, if the capacitance is increased such as through coupling to pad 320 and associated circuitry within the die, the result is a low-impedance load. In contrast, conventional circuit board traces have a relatively higher impedance. If the BGA package substrate trace is used for low-speed signals, the resulting impedance mismatch may be tolerable. This tolerance results from the increased capacitive reactance at lower frequencies. But the transmission of high-speed signals will suffer from this mismatch in that the impedance discontinuity causes the signals to reflect from the discontinuity in addition to passing through the discontinuity. The reflected signal is noise with regard to incoming signals. If a high speed data symbol is reflected due to an impedance mismatch, errors may thus result from the resulting closing of the receive eye. In contrast, the greater spacing between low-speed data signals may be sufficient to accommodate the signal reflections. Thus, whereas a conventional unmatched signal trace may be sufficient for low-speed signals, that lack of impedance matching will be unacceptable for high-speed signals that are driven into a low-impedance load such as pads 320.

To address this impedance mismatch and accommodate higher-speed signal transmission, it is conventional to introduce windows in the ground plane below the pads. In this fashion, the pad capacitance is reduced. But the ground plane windows introduce design complications and costs and may be insufficient to address the capacitive load connected to the package pads. In contrast, relatively-narrow trace section 315 is displaced by a plurality of metal layers and dielectric layers from the ground plane and thus has reduced capacitance as compared to conventional traces used in conjunction with ground windows (although ground windows may also be included with the embodiments disclosed herein). At the same time, the relatively-narrow width of trace section 315 provides an appreciable inductance. This higher inductance counteracts the high capacitance (and thus low impedance) for the load introduced by pad 320. Narrow trace section 315 is thus matched to the relatively high impedance of circuit board traces.

Narrow trace section 315 has too little capacitance to couple directly to the circuit board traces. Thus, each narrow trace section 315 couples to a tapered section 335 that gradually broadens to match a relatively-wide trace section 340. Wide trace section 340 has an inductance/capacitance ratio so as to be impedance matched to the relatively high-impedance traces on the circuit board. Tapered section 335 eliminates or reduces the impedance discontinuity that would otherwise exist between trace sections 315 and 340. Each wide trace section 340 couples through a corresponding via 345 to the underlying circuit board through a solder ball as discussed with regard to FIG. 1.

Although traces 305 may be configured as microstrip with regard to ground plane 310, better electromagnetic performance is achieved by configuring them as co-planar waveguides. Thus, traces 305 are surrounded by a ground shield 350 formed in the metal layer L1. In addition, other ground shields may be formed in intervening metal layers such as a ground shield 355 formed in metal layer L2. A plurality of vias 360 couple shields 350 and 355 to ground plane 310. The resulting co-planar waveguide (CPW) configuration minimizes cross-talk between traces 305. In contrast, the electromagnetic field lines in a microstrip configuration are more spread out, which leads to higher cross-talk between the traces. It will be appreciated, however, that the improved BGA circuit board substrate disclosed herein is not restricted to a CPW embodiment but also includes microstrip and stripline configurations. For example, in less-congested designs cross-talk is reduced in that the traces can be adequately separated. But for a congested design having numerous traces, cross-talk becomes more problematic in that the spacing between traces must be reduced.

Figure 5:
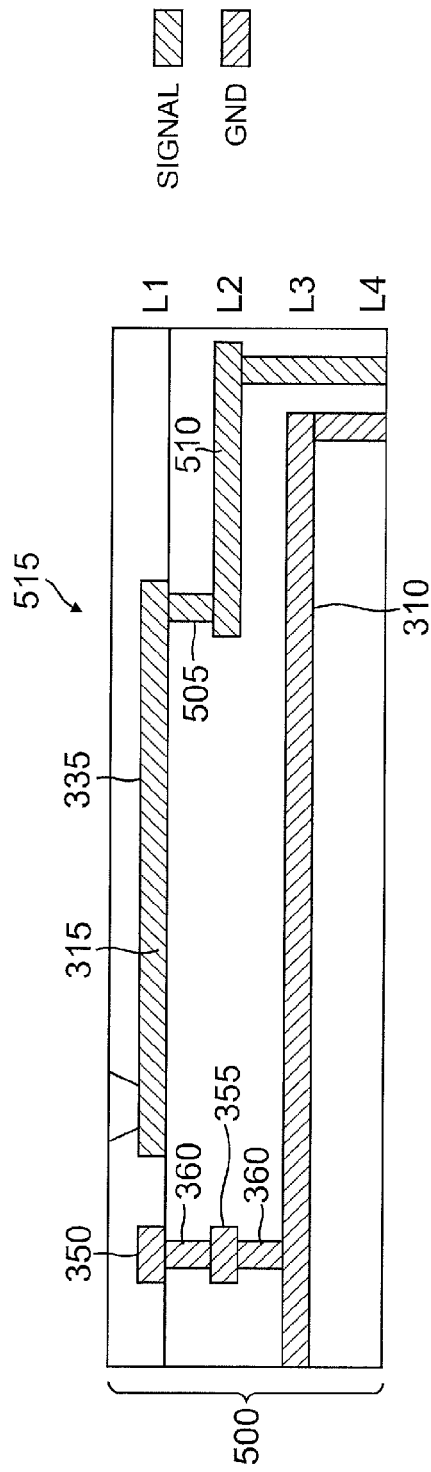
FIG. 5 is a cross-sectional view of an improved BGA package substrate that reduces cross-talk between traces as compared to the embodiment of FIGS. 3 and 4.
Figure 6:
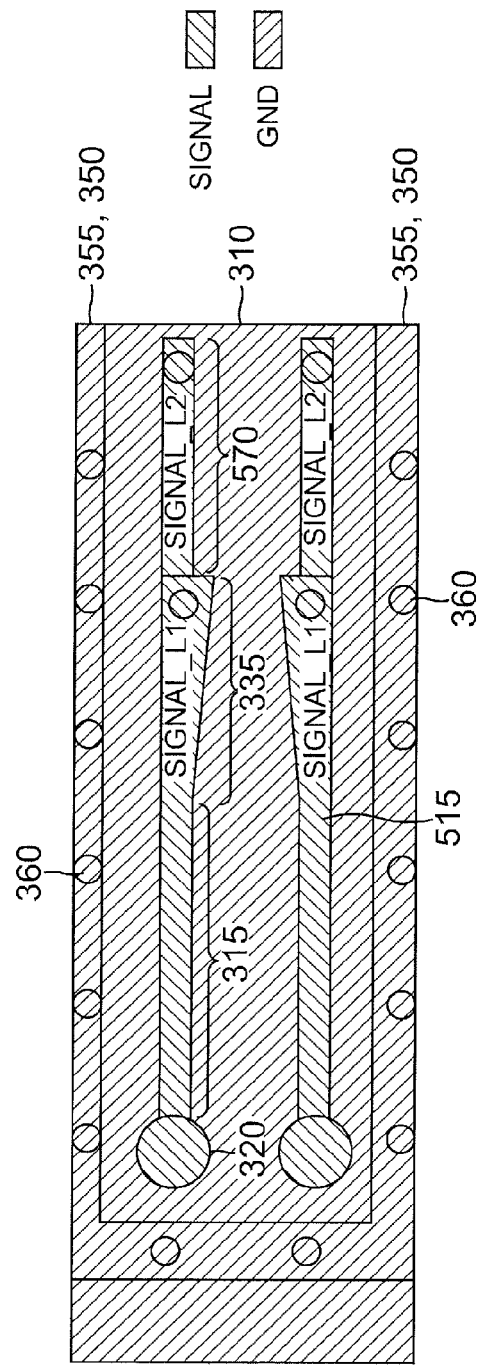
FIG. 6 is a partially-cutaway top view of the improved BGA package substrate of FIG. 5.

Cross-talk between traces can be further reduced as shown in FIGS. 5 and 6. FIG. 5 is a cross-sectional view of a BGA package substrate 500 in which a trace section 510 is formed on metal layer L2 as opposed to the metal layer L1 trace section 340 discussed with regard to FIGS. 3 and 4. Narrow trace sections 315 and tapered sections 335 are formed in metal layer L1 as also discussed with regard to substrate 300. An individual trace 515 is thus formed from a trace section 315, a tapered section 335, and a trace section 510. Metal layer L2 is closer to ground plane 310 so that the electromagnetic field lines are more tightly coupled between each trace section 510 and ground plane 310 (for a given trace width, traces in metal layer L2 will have a higher capacitance and lower inductance as opposed to traces in metal layer L1). In contrast, the spread of the electromagnetic field lines would be wider in embodiments in which trace sections 340 are formed in metal layer L1. Because of this tighter coupling, there is thus reduced cross-talk between traces 515. A via 505 couples each tapered section 334 to its corresponding trace section 510. Not only is cross-talk reduced between traces 515 but the density can be increased as well due to this lower cross-talk. Traces 515 are arranged within ground shields 350 and 355 as discussed with regard to substrate 305.

Figure 7:
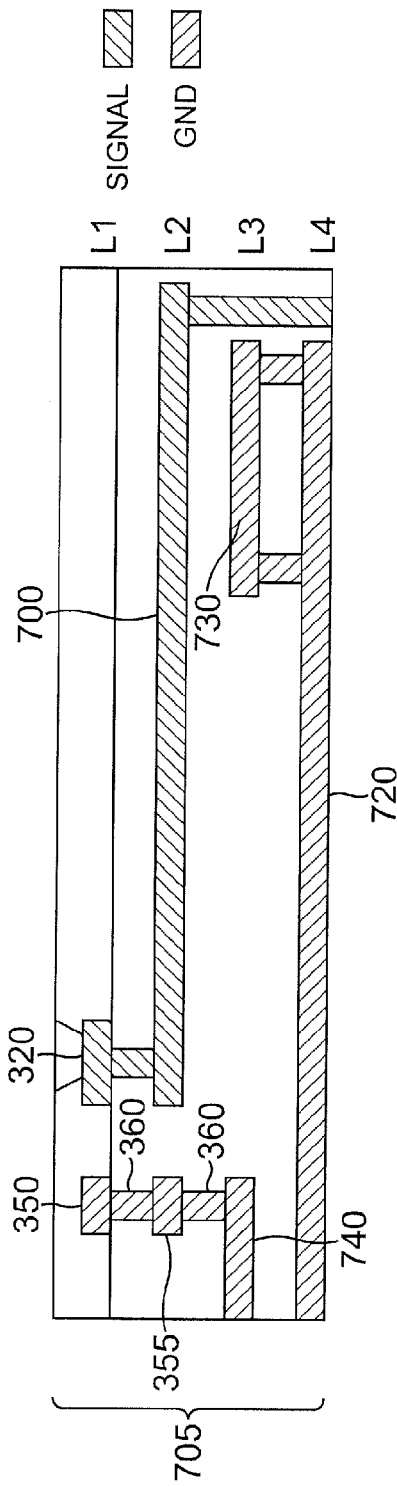
FIG. 7 is a cross-sectional view of an improved BGA package substrate that reduces cross-talk between traces as compared to the embodiment of FIGS. 5 and 6.
Figure 8:
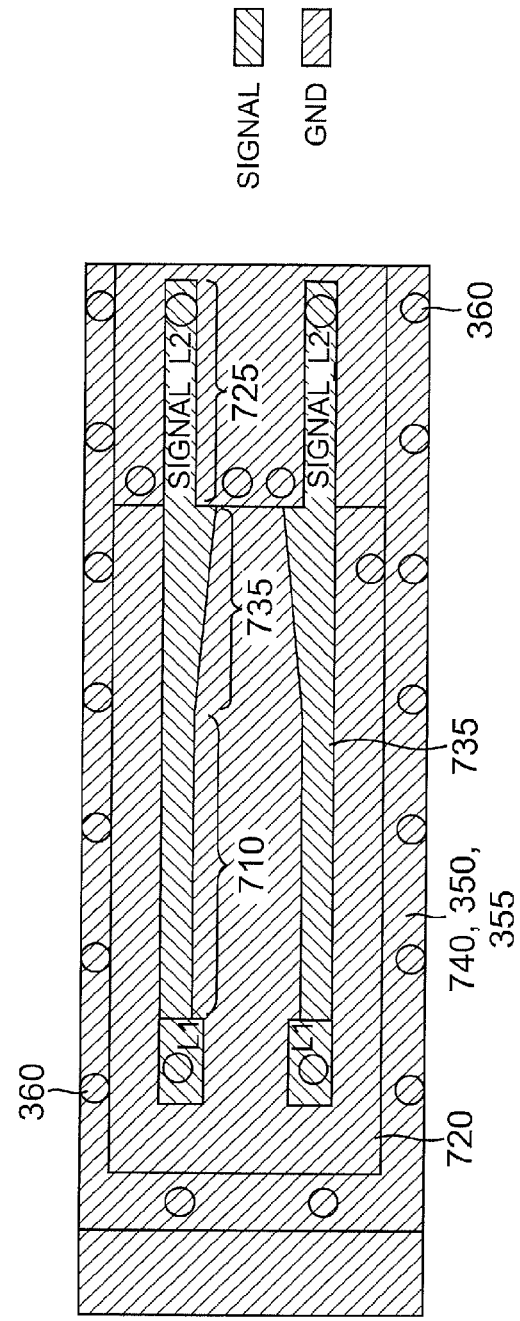
FIG. 8 is a partially-cutaway top view of the improved BGA package substrate of FIG. 7.

If there are sufficient metal layers available, another embodiment to reduce cross-talk even further is illustrated in FIGS. 7 and 8 with regard to a BGA substrate 705. As compared to substrate 500 of FIGS. 5 and 6, one or more traces 700 are formed in metal layer L2 in BGA substrate 705. To minimize cross-talk, traces 700 are shielded by ground shields 350 and 355 as discussed with regard to substrate 300. Each trace 700 includes a load-matched trace section 710 with enhanced inductance to balance the capacitive load for pad 320 (as well as associated circuitry on the die). To provide this enhanced inductance, a ground plane 720 is formed in metal layer L4. Thus, just like trace section 315, trace section 710 is separated from its ground plane by a plurality of intervening dielectric layers and metal layers (where the metal has been etched in the metal layer portion(s) intervening between the signal trace and the ground plane). In this fashion, the capacitance is reduced, and the relatively-narrow width for trace section 710 provides a relatively-high level of inductance. This same width can be used for a board-matched trace section 725 because a secondary ground plane 730 is formed in metal layer L3.

There is thus greater capacitance between trace section 725 and secondary ground plane 730 as opposed to the capacitance between load-matched trace section 710 and ground plane 720. This greater capacitance leads to a board-matched impedance despite trace section 725 having the same width in one embodiment as load-matched trace section 710. A tapered section 735 softens the transition between sections 710 and 720 and reduces reflections accordingly. Metal layer L3 may also form another ground shield 740. Because trace 700 is shielded by ground shields in metal layers L1, L2, and L3, cross-talk is minimized. Moreover, the density of traces 700 may be increased accordingly.

It will be appreciated that the techniques and concepts discussed herein are not limited to the specific disclosed embodiments. The appended claims encompass all such changes and modifications as fall within the true spirit and scope of this invention.

We claim:

1. A circuit comprising:
a ball grid array (BGA) package substrate including a plurality of metal layers,
a plurality of pads configured within a first metal layer;
a plurality of traces configured within the first metal layer, the plurality of traces corresponding to the plurality of pads such that each trace extends from its corresponding pad to a corresponding via and includes a first section coupled to its corresponding pad having a first width, a second section coupled to its corresponding via having a second width greater than the first width, and a tapered section extending between the first and second sections and tapering between the first and second widths, and
a ground plane configured within a second metal layer, the ground plane underlying the plurality of traces.

2. The circuit of claim 1, further comprising a ground shield configured within the first metal layer, the ground shield extending along a first side of the trace and along an opposing second side of the trace.

3. The circuit of claim 1, wherein the tapered section linearly tapers between the first and second widths, and wherein at least a third metal layer is between the first and second metal layers.

4. The circuit of claim 1, further comprising a flip-chip die coupled to the plurality of pads through solder bumps, each pad coupling to circuitry within the flip-chip die such that each pad presents a low-impedance load to the corresponding trace.

5. The circuit of claim 4, wherein the first width for each first section and a separation between the first and second metal layers is such that an inductance for each first section balances the low-impedance load.

6. The circuit of claim 4, wherein the BGA package substrate mounts to a printed circuit board including a plurality of high-impedance circuit board traces, and wherein each trace in the BGA package substrate couples through its via to a corresponding one of the high-impedance circuit board traces.

7. The circuit of claim 6, wherein the second width for each second section and a separation between the first and second metal layers is such that each second section is impedance matched to the high-impedance circuit board traces.

8. The circuit of claim 7, wherein an impedance for the high-impedance circuit board traces is 50Ω.

9. A circuit comprising:
a ball grid array (BGA) package substrate including a plurality of metal layers, the plurality including a first metal layer, a second metal layer, and a third metal layer,
a ground plane formed in the third metal layer;
a plurality of pads configured within the first metal layer, wherein at least the second metal layer intervenes between the first and third metal layers; and
a trace configured within the first metal layer and the second metal layer, the trace including a first section configured in the first metal layer to extend from one of the pads to a tapered section, the first section having a first width, the tapered section extending in the first metal layer from the first section to a first via, the tapered section tapering from the first width to a second width that is greater than the first width, the trace further including a second section configured in the second metal layer, wherein the second section has a second width configured such that the second section is matched to a circuit board trace.

10. The circuit of claim 9, wherein the tapered section is linearly tapered from the first width to the second width.

11. The circuit of claim 9, wherein the first metal layer is an uppermost metal layer that is adjacent a solder resist layer.

12. The circuit of claim 9, wherein the plurality of metal layers comprises a plurality of eight metal layers.

13. The circuit of claim 12, wherein metal layers in the plurality besides the first, second, and third metal layers are configured with traces for low-speed signals.

14. The circuit of claim 9, further comprising a ground shield configured within the first metal layer, the ground shield extending along a first side of the first section and the tapered section and along an opposing second side of the first section and the tapered section.

15. The circuit of claim 14, further comprising an additional ground shield configured within the second metal layer.

16. A circuit comprising:
a ball grid array (BGA) package substrate including a plurality of metal layers, the plurality including a first metal layer, a second metal layer, and a third metal layer,
a ground plane formed in the first metal layer;
a plurality of pads configured within the second metal layer, wherein at least the third metal layer intervenes between the first and second metal layers; and
a trace configured within the third metal layer, the trace including a first section configured to extend from a first via coupled to one of the pads to a tapered section, the first section having a first width, the tapered section extending in the third metal layer from the first section to a second section of the trace, the tapered section tapering from the first width to a second width that is greater than the first width, the second section extending from the tapered section to a second via that couples to a circuit board trace.

17. The circuit of claim 16, further comprising a secondary ground plane configured within a fourth metal layer, wherein the fourth metal layer lies between the first and third metal layers.

18. The circuit of claim 17, wherein the secondary ground plane extends only below the second section of the trace.

19. The circuit of claim 16, further comprising a flip-chip die coupled through a solder bumps to the pads, and wherein each pad and associated circuitry within the flip-chip die present a low-impedance load as compared to an impedance of the circuit board trace.

20. The circuit of claim 19, wherein the first width of the first section of the trace is such that an inductance of the first section matches the low-impedance load to the impedance of the circuit board.

\* \* \* \* \*